(12) United States Patent
Aragona

(10) Patent No.: US 6,895,539 B1
(45) Date of Patent: May 17, 2005

(54) UNIVERSAL METHOD AND APPARATUS FOR CONTROLLING A FUNCTIONAL TEST SYSTEM

(75) Inventor: Daniel Aragona, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 923 days.

(21) Appl. No.: 09/675,732

(22) Filed: Sep. 29, 2000

Related U.S. Application Data

(60) Provisional application No. 60/225,818, filed on Aug. 16, 2000.

(51) Int. Cl.[7] .............................................. G01R 31/28
(52) U.S. Cl. ........................................ 714/724; 714/37
(58) Field of Search ............................ 707/8; 710/302; 718/101; 719/316; 709/316, 203; 714/724, 37

(56) References Cited

U.S. PATENT DOCUMENTS

| | | | |
|---|---|---|---|
| 5,812,768 A | | 9/1998 | Page et al. |
| 5,832,483 A | * | 11/1998 | Barker .......................... 707/8 |
| 6,141,696 A | | 10/2000 | Goertzel et al. |
| 6,349,342 B1 | | 2/2002 | Menges et al. |
| 6,567,875 B1 | * | 5/2003 | Williams et al. ............ 710/302 |
| 6,618,817 B1 | | 10/2003 | Armstrong |
| 6,631,425 B1 | | 10/2003 | Helland et al. |
| 6,742,015 B1 | * | 5/2004 | Bowman-Amuah ......... 718/101 |
| 6,772,228 B1 | * | 8/2004 | Aragona ..................... 719/316 |

OTHER PUBLICATIONS

Dr. Gui on Components, COM and ATL; Printed Jul. 2000; http://msdn.microsoft.com/library/welcome/dsmsdn/msdn__drguion02098.htm.

Sara Williams and Charlie Kindel; "The Compotent Object Model A Technical Overview"; Created; Oct. 1994; Adapted from Article in Dr. Dobbs Journal; Dated Dec. 1994; http://msdn.microsoft.com/library/techart/msdn__comppr.htm.

Dr. Richard Grimes; "Beginning ATL COM Programming"; Published by Wrox Press Ltd. 1998; ISBN 1–861000–11–1; pp. 1–101; Copyright 1998.

* cited by examiner

*Primary Examiner*—David Ton
(74) *Attorney, Agent, or Firm*—Blakely, Sokoloff, Taylor & Zafman LLP

(57) ABSTRACT

An improved host controller application for controlling the testing of manufactured units such as circuit boards. The improved host controller uses a unique system and method for accessing and utilizing new or different functionality so that the application may easily be adapted to changing manufacturing environments, such as using different tests to test manufactured units or circuit boards. More specifically, a system and method is provided that allows a host controller to interoperate with and obtain a result from a derived server having a first functionality based on an existing relationship between the client and a base server having a second functionality. The existing relationship is based on one or more unique identifiers that may be associated with an interface of the base server and which may be used to interoperate with encapsulated data and methods. The system and method includes making one or more unique identifiers associated with the derived server identical to one or more unique identifiers associated with the base server.

27 Claims, 9 Drawing Sheets

UNIVERSAL METHOD AND APPARATUS FOR CONTROLLING A FUNCTIONAL TEST SYSTEM

This patent application claims priority and benefit under 35 U.S.C. 119 (e) to U.S. Provisional Application No. 60/225,818 filed on Aug. 16, 2000.

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The invention relates generally to a system and method for testing manufactured units such as circuit boards. More specifically, the invention relates to a universal host controller and a unique system and method for accessing and utilizing software servers to perform the testing of manufactured units or circuit boards.

2. Background Information

An interesting trade-off has developed in certain areas of software application development. Two qualities that are desired in the development of most software applications, universality and changeability, are often at conflict.

Universality refers to development of applications that are portable to different software platforms, languages, and hardware and that may be operated on distributed networks using software that has already been developed by other software developers. Java, ActiveX, and Component Object Modeling (COM) are exemplary development tools that may be used to make applications more universal.

Universality may be better understood through a more detailed discussion of COM. COM has been developed to specify how objects interact and communicate within a single application, a distributed application or between applications (e.g., client/server applications) by defining a set of standard interfaces. Object interfaces are groupings of semantically related functions through which a client application and utilizes the services of a server application. COM is a binary, network standard that allows software components to communicate with each other regardless of what machine they are running on, what operating system the machines are running (provided that it supports COM), and what language the components are written in (e.g., C, C++, Small Talk®, Ada, and Basic) provided they are capable of calling functions using pointers. COM further provides location transparency, meaning that software components may be written without knowledge of whether the other components are in-process DLLs, local EXEs, or located on another machine. Thus, COM has several desirable universal qualities. Further background information on COM is widely available, including the following references: (1) Beginning ATL COM Programming, Grimes, Stockton, Templeman and Reilly, Wrox Press, 1998 (ISBN 1-871000-11-1), and (2) Beginning Visual C++5, Chapter 22, Ivor Horton, Wrox Press, 1997 $_1$(ISBN 1-871000-08-1).

Paramount to COM is that a client does not need to know the internal workings of a published COM server (encapsulation) and that a COM server must always maintain complete backward compatibility to all existing client code. A strictly obeyed rule that once a COM object has been published (made available to the public) neither the functionality, unique identifiers, or interface of that COM object may be changed. Otherwise clients that were developed based on a reliance on the initial COM server would either not be operable (i.e., the applications may crash) or they would need recompilation every time one of the COM servers they access is changed. This would compromise much of the universality that COM provides. Accordingly, in COM new functionality has always been added by creating a new interface and unique identifier that is associated with the new functionality. This new functionality is not available to clients without modifying or recompiling the application. That is, universality is obtained at the expense of changeability.

Software should also be changeable, so that it may be adapted to changes in the real world or be improved. Accordingly, a software architecture that allows software or software objects to be changed easily and without recompilation is desirable.

Polymorphism is a widely used mechanism for implementing changeability in an object-oriented environment, however in COM the concept of an interface significantly limits polymorphism. Polymorphism allows an object to produce different results depending upon the type of object that invokes the object. For example, considering the base class shape, a polymorphic method for calculating area will produce different results if a circle and a square call the method.

COM provides containment and aggregation for achieving a limited form of polymorphism. One problem with both containment and aggregation is that objects and applications do not know how to interoperate with the new functionality provided through containment or aggregation. For example, the objects and applications may not know the Universally Unique Identifiers (UUIDs) associated with the new functionality. The UUIDs provide an unambiguous way to interoperate with a COM items or functionality without the possibility of name clashes between other items created by different people around the world. To interoperate, the object or application must know the exact path to import the interfaces from the COM items associated with the new functionality. Thus, changeability is significantly restricted.

Thus, prior art approaches for obtaining more universal software, such as COM, are based on creating an encapsulated, unchanging functionality that is accessed through an unchanging interface. This approach limits the way that software may be changed to be adapted to the real world and to be improved. Accordingly when COM is used for software application development, some of the advantages of changeability are sacrificed to gain universality. Similar limitations are expected in other software environments where universality is achieved by encapsulating functionality and interoperating through an interface or standard.

DESCRIPTION OF THE SEVERAL VIEWS OF THE DRAWINGS

The novel features believed characteristic of the invention are set forth in the appended claims. The present invention is illustrated by way of example, and not by way of limitation, in the figures of the accompanying drawings and in which like reference numerals refer to similar elements. The invention itself, however, as well as a preferred mode of use, will best be understood by reference to the following detailed description of an illustrative embodiment when read in conjunction with the accompanying drawings:

DESCRIPTION OF THE INVENTION

Figure 1A:
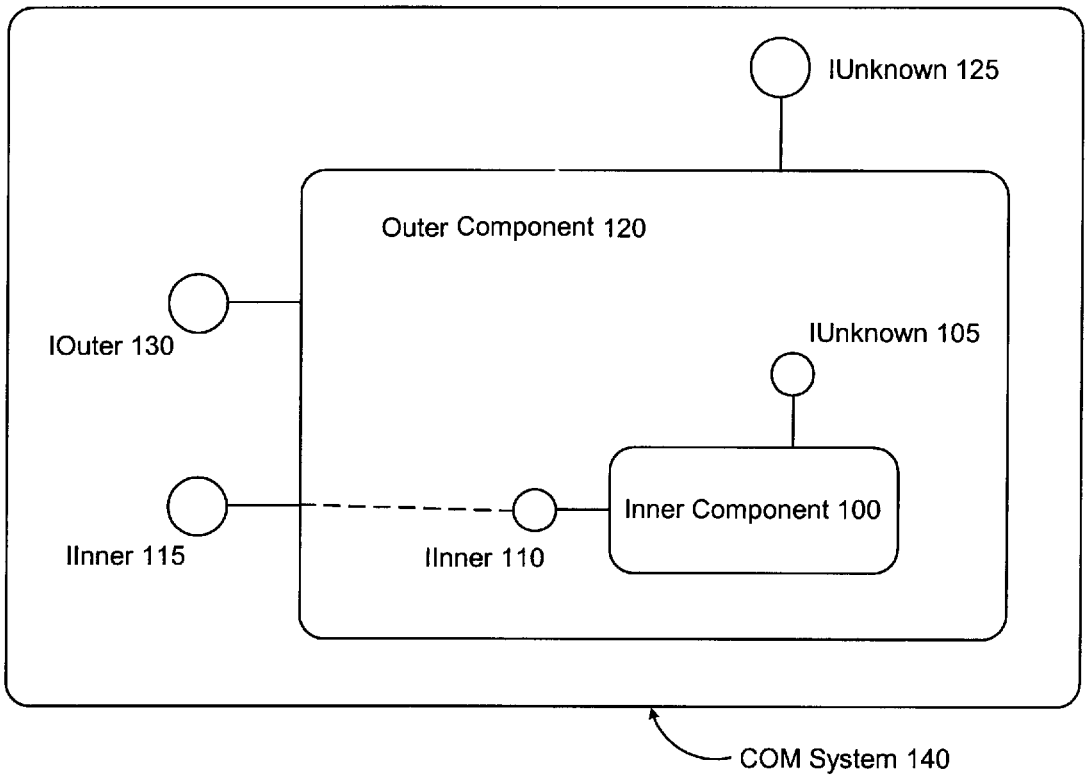
FIG. 1a shows prior art containment in COM.

It is desirable to have a software environment and architecture that allows universality (e.g., portable to any software platform and that is operable on any hardware, including instrumentation and equipment made by different vendors) and also changeability (e.g., that may adapt to changes in the real world). These goals are not available together in prior art software environments and architectures. A software environment and architecture that allows this combination is desirable in general, and in would be of particular use in an environment subjected to routine procedural, equipment, and other changes, such as the testing of circuit boards.

Broadly stated, embodiments of the present invention seek to provide both universality and changeability in a COM-based software architecture or the like by allowing a client to interoperate with and obtain a result from a server that has a new or modified functionality, based on an existing relationship between the client and a different server having an existing and different functionality. For example, in one embodiment, polymorphism is obtained in a COM-based software architecture for testing circuit boards by allowing an application that controls the testing to interoperate with and obtain a result from a derived server having a first functionality, based on an existing communication relationship that involves a COM interface and set of UUIDs that allow the application to interoperate with a base server having a second functionality. Broadly stated, in certain embodiments certain information associated with the relationship between a client and a first server, such as one or more unique identifiers associated with an interface, may be copied or shared with a second server to allow the second server to also communicate and interoperate with the client.

In the following description, for the purpose of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps, which will be described below. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software.

The present invention may be provided as a computer program product that may include a machine-readable medium having stored thereon instructions that may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Terminology

Before providing a detailed explanation of the present invention and various exemplary embodiments of the present invention, some terms that will be used throughout this application will briefly be defined.

Aggregation: In COM, a construct involving an inner COM component integral with an outer COM component, where an interface of the inner COM component is exposed to objects outside of the outer COM component. Aggregation is a prior art approach for achieving a limited degree of polymorphism in COM.

Base Server: A type of server that has an existing association with a client. In one embodiment, the existing association includes one or more unique identifiers associated with the base server.

Changeability: A desirable characteristic for software that makes it able to adapt to changes in the real world or to be improved or modified. In one embodiment, changeability may apply to a client that is able to access new or changed functionality provided by a server.

Circuit Board: A manufactured circuit product. In one embodiment, the circuit board is a printed circuit board. In another embodiment the circuit board may be a processor system board.

Client: An application, application server, server, COM server, or hardware component that requests processing from a server.

COM: A specification and a set of services that allows a programmer to create modular, object-oriented, customizable and upgradeable, distributed applications using a number of languages.

COM Server: A server in a COM environment that contains one or more interfaces for interoperation with one or more other applications, objects, COM components, or COM servers. In one embodiment, a COM server may be compiled code distributed as either DLLs or EXEs. A COM server has an interface, typically a table of function pointers, to expose particular functionality associated with the COM server to one or more clients. In one embodiment, a COM server may be partially inconsistent with the COM specifications, such as when a derived COM server is modified to include a UUID associated with a base COM server.

Containment: A COM construct involving an inner COM component that is contained within an outer COM component. The outer COM component having an interface that corresponds to an interface associated with the inner COM component. Containment is a prior art approach for achieving a limited degree of polymorphism in COM.

Derived Server: A type of server that has or will be given an association with a client based upon an existing association between a client and a base server. In one embodiment, association will be based on one or more unique identifiers that allow the base server to interoperate with the client.

Functionality: One or more calculations, operations, or instructions that may be performed by software, such as applications, objects, and COM servers. In one embodiment, functionality includes methods accessible through a COM server's interface.

Host Controller (also universal host controller): Software used in the testing of units. In one embodiment, the host controller may manage and control various operations involved in the functional testing of circuit boards or microprocessor circuitry.

IDL (Interface Definition Language): A language used to define an interface in COM. The language includes attributes added to the code in square brackets.

IDL file: A file written in or associated with the Interface Definition Language. In one embodiment, an IDL file is a file associated with COM objects. An IDL file may be edited to achieve certain features of the present invention.

Interface: An interface may be used when a client interoperates with a server. In one embodiment the interface includes functions or methods that allow a client to and utilize a server. In one embodiment, an interface is a COM interface through which a client may access functionality associated with a COM server.

Interface Pointer: A pointer to a function associated with an interface. In one embodiment, the interface pointer may point to a table or list of functions, such as a vtable in C++.

Interoperate: Communication and processing activities occurring between a client and a server. In one embodiment, a client accesses and utilizes the services of a COM server and obtains a result based on the functionality associated with the COM server.

Polymorphism: The capability to process objects differently depending on their data type or class.

Server: Software that provides functionality to a client. In one embodiment, a server may be a COM server.

Testing: Testing a unit. In one embodiment, testing involves functional testing of circuit boards. For example, when testing RAM, opens, stucks, shorts, bad memory cells, and incorrect addressing may be detected. Other exemplary testing of circuit boards may include, testing for CPU signals, ROM CRC, bus, RAM bus, short RAM, long RAM, RAM parity, DRAM refresh, R/W memory, dump memory, fill and check memory, R/W import/output, I/O bus.

Unique Identifier: Any unique and unambiguous identification for software, such as a server. In one embodiment the unique identifier may be a large, statistically unique computer-generated n-bit number. The unique identifier may include information associated with the generating computer, such as a network address or Ethernet card and may include information associated with a time the unique identifier generated. The unique identifier may be compatible with the system registry, so that the unique identifier can be stored in the system registry. In another embodiment a unique identifier may be a UUID, GUID, or CLSID. Software such as the GUID generator Guidgen.exe may be used to generate the unique identifiers. In one embodiment the unique identifier is associated with COM. For example, an IDL file in COM may have at least three unique identifiers, including an object UUID to identify the interface for the COM server, a TypeLibrary UUID, and a CLSID to identify an interface as a particular class or object. Unique identifiers of the same or a different nature may also be used to represent manufactured units and circuit boards, in addition to software. For example, a unique identifier may be a barcode, alphanumeric characters and symbols, or other means for identifying a unit or circuit board.

Unit: A manufactured product or other item that may be tested by the system and method of this application. In one embodiment, a unit may be a circuit board.

Unit Type: A type of a unit. In one embodiment, a unit type may be an Intel Pentium® III processor board. A unit type may be used to link a unit to be tested with a server or COM server to be used in testing the unit.

Unit Under Test (UUT): A unit located in a test fixture and either in a state of readiness to be tested, being tested, or in a state of readiness for removal from the test fixture.

Universality: A desirable characteristic for software that makes it compatible with other software and hardware. In one embodiment, universality may apply to a universal host controller and may include characteristics to that allow the host controller to interoperate with a test suite, control any test system hardware, and communicate with any factory database system.

Containment and Aggregation

A COM system 140 exhibiting containment is illustrated conceptually in FIG. 1a. As shown, inner component 100 includes a standard IUnknown interface 105 and an inner interface 110, both of which may allow access to particular functionality associated with inner component 100. Typically, interfaces and other COM items have Universally Unique Identifiers (UUIDs) that provide a unique way of referring to the item without the possibility of name clashes between other items created by different people around the world. For example, the standard IUnknown 115 interface, which exists in all COM servers by requirement of COM, may have the UUID 00000000-0000-0000-C000-000000000046. These UUIDs associated with interfaces and other COM items are necessary for unambiguous communication and interoperation between COM components. An external IInner interface 115 has also been added to the outer component 120 so that the particular functionality of the inner component 200 associated with IInner 110 is interoperable with and may be extended to components and applications external to COM system 140. The distinguishing feature of containment is that both the inner component 100 and its standard IUnknown 105 and IInner 110 interfaces are completely contained within the outer component 120. The outer component 120 also includes standard IUnknown interface 125 and IOuter interface 130 which both allow functionality associated with the outer component 220 to be interoperable with and extensible to components and applications external to the outer component 120. In certain situations, the functionality of the inner component 100 is initiated and released by the outer component 120, which acts like a client to the inner component 100.

Figure 1B:
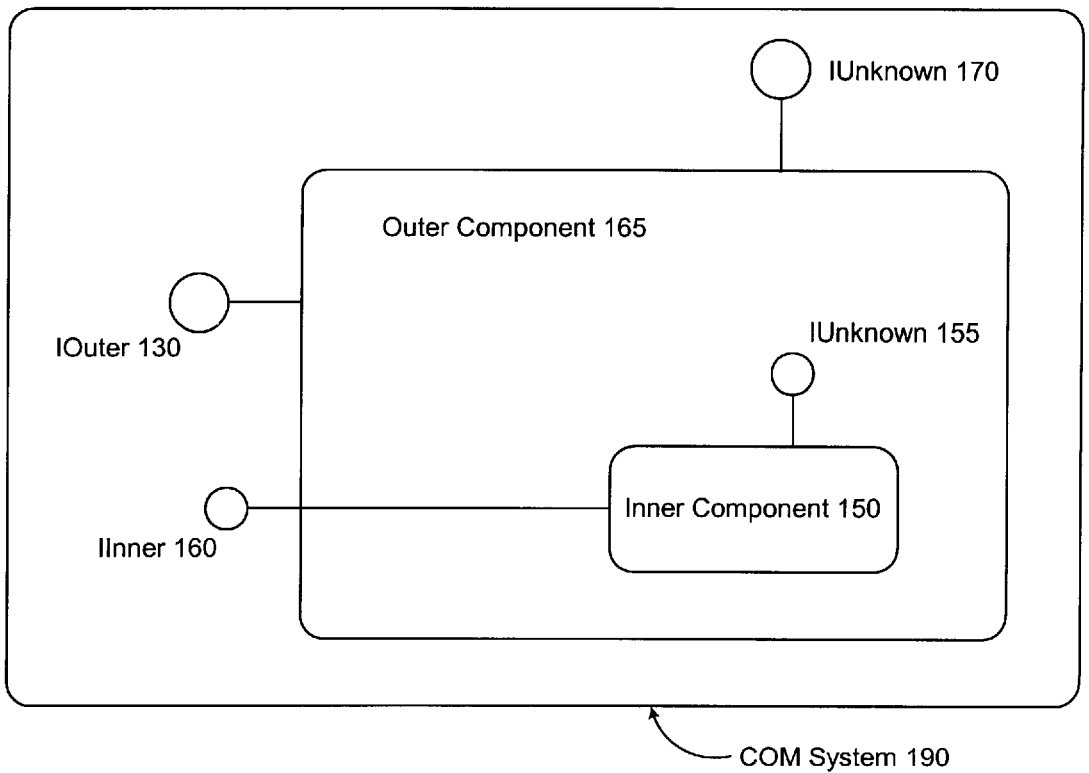
FIG. 1b shows prior art aggregation in COM.

A COM system 190 exhibiting aggregation is illustrated conceptually in FIG. 1b. The distinguishing feature of aggregation is that the inner component is integral within an outer component 165, but with the inner interface 160 exposed external to the outer component 165. Accordingly, an associated external interface on the outside component 165 is not required to enable inner component 150 to interoperate with objects and applications external to COM system 190.

Frequently, existing COM servers such as the COM servers shown in the contained COM system 140 or the aggregated COM system 190 of FIGS. 1a–b will need to be modified in order to encompass new or improved functionality. COM typically requires that a new interface be provided to access and utilize any new or changed functionality. Increasing the functionality of an existing COM server by containment and aggregation will be discussed briefly below.

Figure 2A:
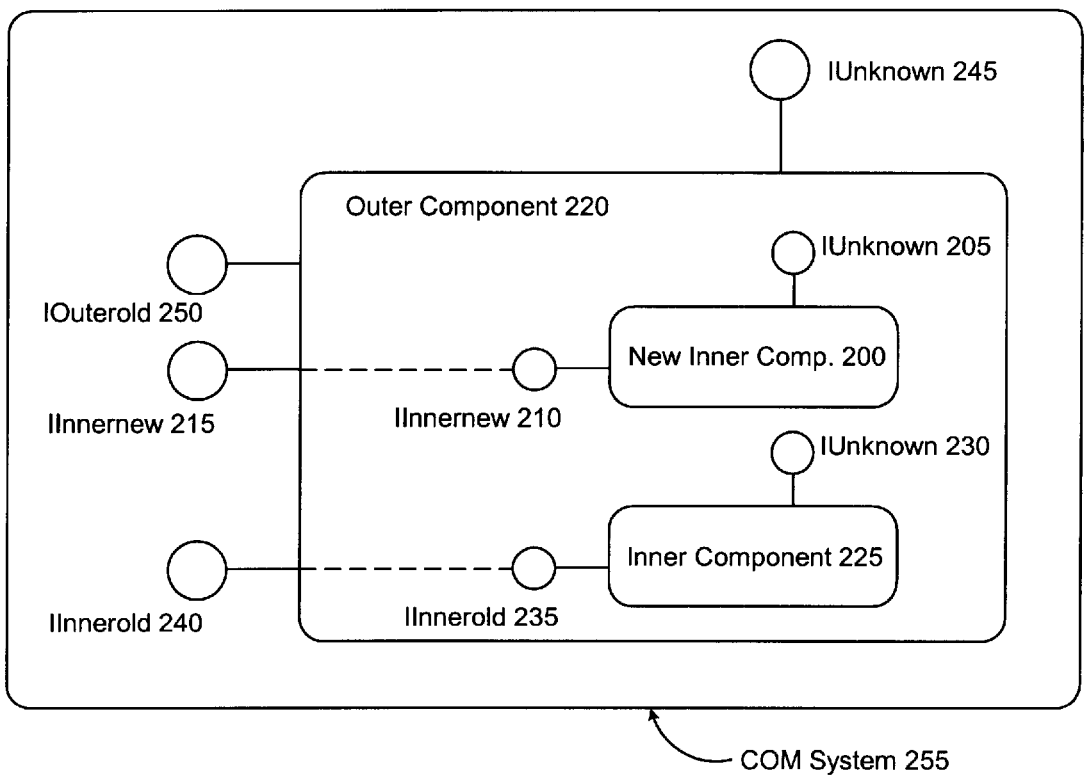
FIG. 2a shows a prior art approach for achieving polymorphism through containment in COM.
Figure 2B:
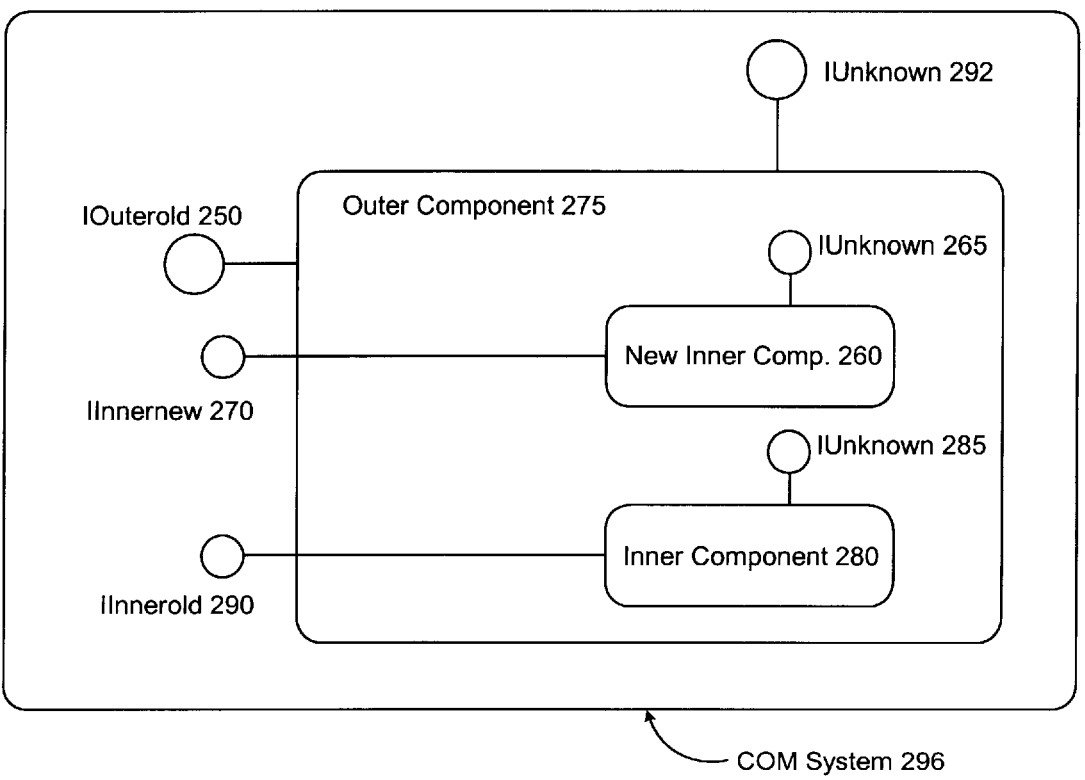
FIG. 2b shows a prior art approach for achieving polymorphism through aggregation in COM.

FIG. 2a shows a COM system 255 exhibiting containment that is similar to the COM system 140 shown in FIG. 1a, with the notable exception that a new inner component 200 has been added to the system 255 to introduce a new functionality. The new inner component 200 includes a standard IUnknown interface 205 and a new IInnernew interface 210, both of which may allow access to new functionality associated with new inner component 200. A new external IInnernew interface 215 has also been added to the outer component 220. FIG. 2b shows the analogous new functionality added to a COM system 296 exhibiting containment that is similar to the COM system 190 shown in FIG. 1b. Again, in order to obtain interoperation between objects and applications external to COM system 296 and new inner component 260, certain information about 260 must be available to the external objects and applications.

Exemplary Use of The Invention: Testing of Circuit Boards

Figure 3:
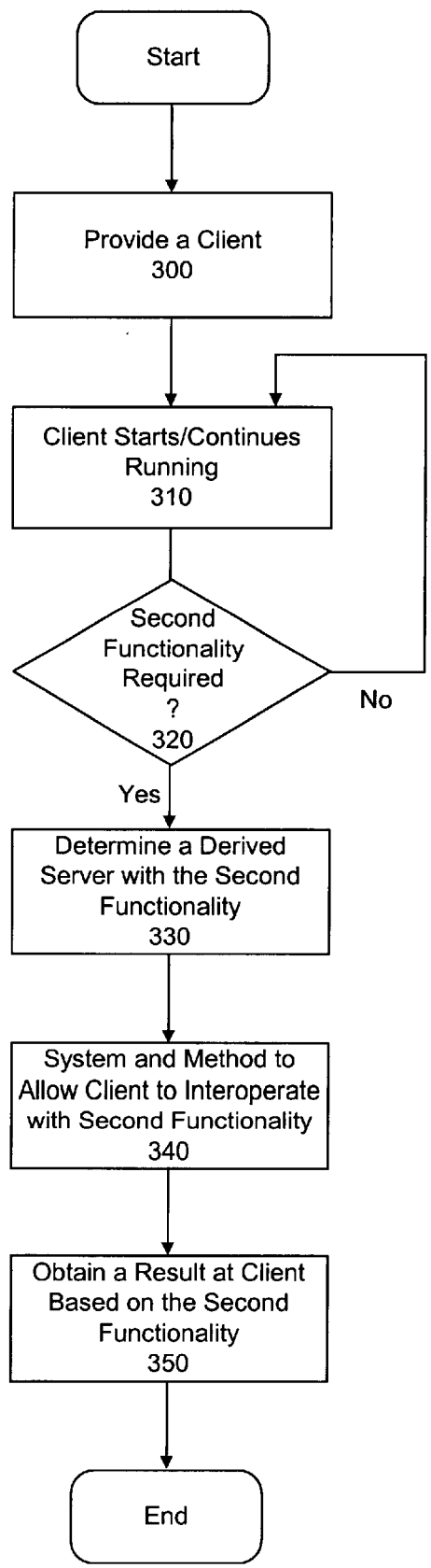
FIG. 3 is a block diagram showing the context of use of one embodiment of the present invention in the field of circuit board testing.

FIG. 3 is a block diagram showing an exemplary context of use of certain embodiments of the present invention. FIG. 3 relates to the testing of circuit boards. Block 300 shows an existing client that controls circuit testing and that interoperates with one or more base COM servers through one or more interfaces. In this embodiment the base COM server has a first functionality that includes the minimum necessary functionality for COM (e.g., the IUnknown interface) and functionality associated with the testing of a first type of circuit board. However, in some embodiments, the base COM server may have only the minimum necessary functionality.

At block 310 the client is initiated. By way of example, the client may access and use the base COM server to test one or more circuit boards of a first type. The client may also access additional COM servers, other software applications, and may perform operations inherent to the client.

At block 320 the client determines whether it needs a second functionality that is not associated with the base COM server. For example, the client may complete the testing of a circuit boards of the first type and determine that the next circuit board to be tested is of a second type. This determination may be made by using a barcode scanner to scan a barcode on the circuit board, followed by determining that the base COM server is not suitable for testing the circuit board type corresponding to the barcode. A new test that is operable to perform different tests, cause different currents, voltages, or power to be applied, may be needed. In some embodiments, the client may contain conditional statements to select a new, derived COM server.

In one embodiment, the client may not be operable to obtain a result based on the second functionality by interoperating with the derived COM server. One possible reason is that the client may not have information, such as one or more UUIDs, for interoperation with the derived COM server. In one embodiment, the client may be created to interact with the base COM server, with the intention of using a system and method for making derived COM servers that may be transparently changed and substituted for the base COM server according to the system and method of certain embodiments of the present invention. Advantageously, this will allow the client to access and utilize derived COM servers that may be created after the client was written and last compiled.

At block 330 the client determines one or more derived COM servers that are associated with the second functionality. In one embodiment, the client may use information contained in the barcode on the circuit board to look up the applicable derived COM server in a database or table, such as a factory database.

At block 340, a system and method are applied to enable the client to interoperate with a derived COM server having the second functionality. For example, information such as one or more UUIDs that allow the client to interoperate the base server may be used to allow the client to interoperate with the derived server. In one embodiment the derived COM server may be changed and substituted for the base COM server so that it may interoperate with the client.

At block 350, the client accesses the derived COM server and obtains a result based upon the second functionality. For example, the client may access the second functionality associated with the derived COM server and test the circuit board of the second type.

The invention is not limited to the exemplary use described above or to the testing of circuit boards. Rather, in certain embodiments the system and method may be used to access and utilize different functionality in a general-purpose application (e.g., word processor, spreadsheet, or database application), an application distributed over an Intranet or the Internet, or another software application. The invention is also not limited by the way a client determines that a second functionality is needed or determines a derived COM server to provide the functionality. For example, data may be entered by a user through a keyboard, through a mouse selection of a pull-down menu, through a credit-card reading device, or through any other data entry devices. The client may also use any method to determine the corresponding derived COM server based upon a needed functionality. These are implementation details that do not limit the scope of certain embodiments of the invention.

Figure 4A:
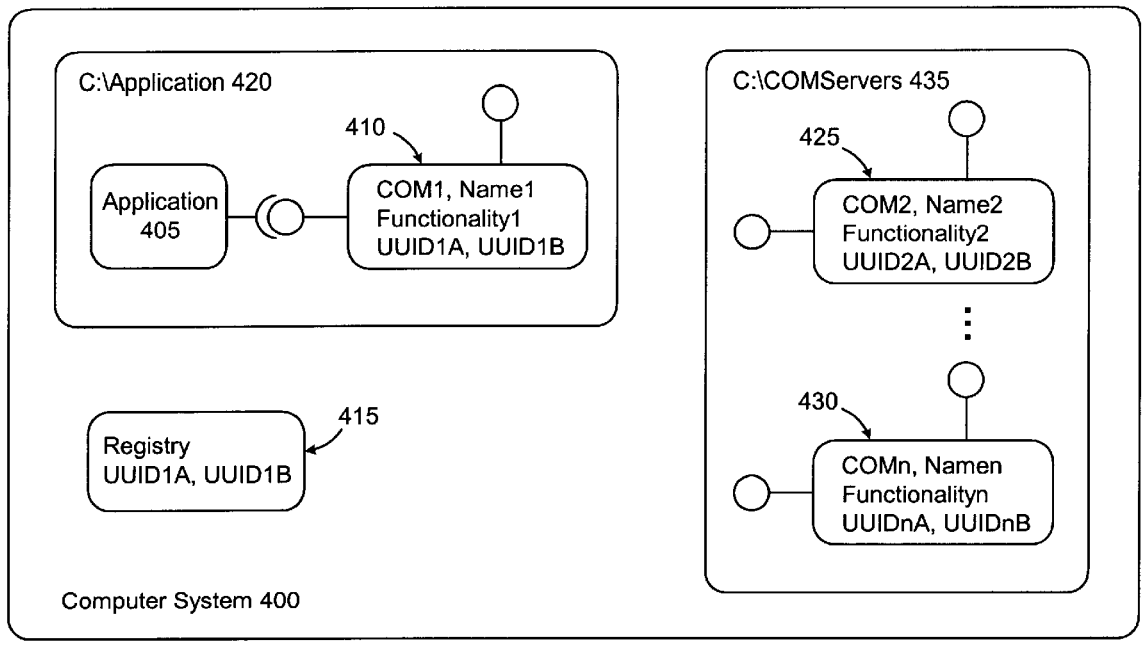
FIGS. 4a and b conceptually show the invention according to one embodiment.
Figure 4B:
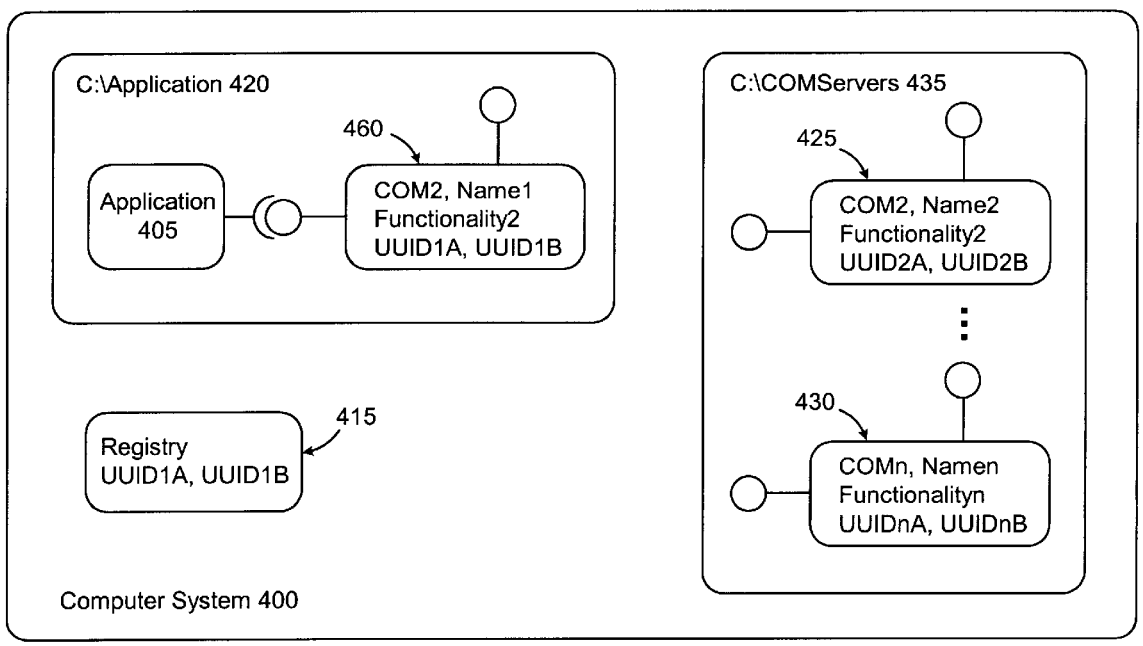

System and Method for Allowing a Client to Interoperate with a Server Having a Different Functionality FIGS. 4a and 4b conceptually show the invention according to one embodiment. FIG. 4a shows a computer system 400 containing two directories, C:\Application 420 and C:\COMServers 435, and a registry 415. The directory C:\Application 420 includes software application 405 that interoperates with COM server COM1 410 through an interface associated with COM1 410. The COM server COM1 410 has attributes including name1, functionality1, the unique identifiers UUID1A and UUID1B. These unique identifiers have been registered in registry 415 associated with computer system 400. Also included in computer system 400 is the C:\COMServers 435. C:\COMServers 435 includes a plurality of COM servers including COM2 425 and COMn 430. COM2 425 has attributes name2, functionality2, UUID2A, and UUID2B, and COMn 430 has attributes Namen, functionalityn, UUIDnA, and UUIDnB.

FIG. 4b shows computer system 400 after a system and method 440, according to one embodiment of the invention, for allowing application 405 to interoperate with COM2 460 and obtain a result based upon functionality2. As shown in FIG. 4b, the system and method 440 includes making a name of COM2 460 identical to the name of COM1 410 (i.e., identical to name1). The system and method 440 also includes making unique identifiers of COM2 460 identical to the unique identifiers of COM1 410 (i.e., identical to UUID1A and UUID1B). UUID1A and UUID1B are registered in registry 415. Accordingly, when application 405 seeks to interoperate with COM1 it will access the unique identifiers UUID1A and UUID1B from the registry 415 and use the unique identifiers to interoperate with COM2 460 and obtain a result based on functionality2.

Figure 5A:
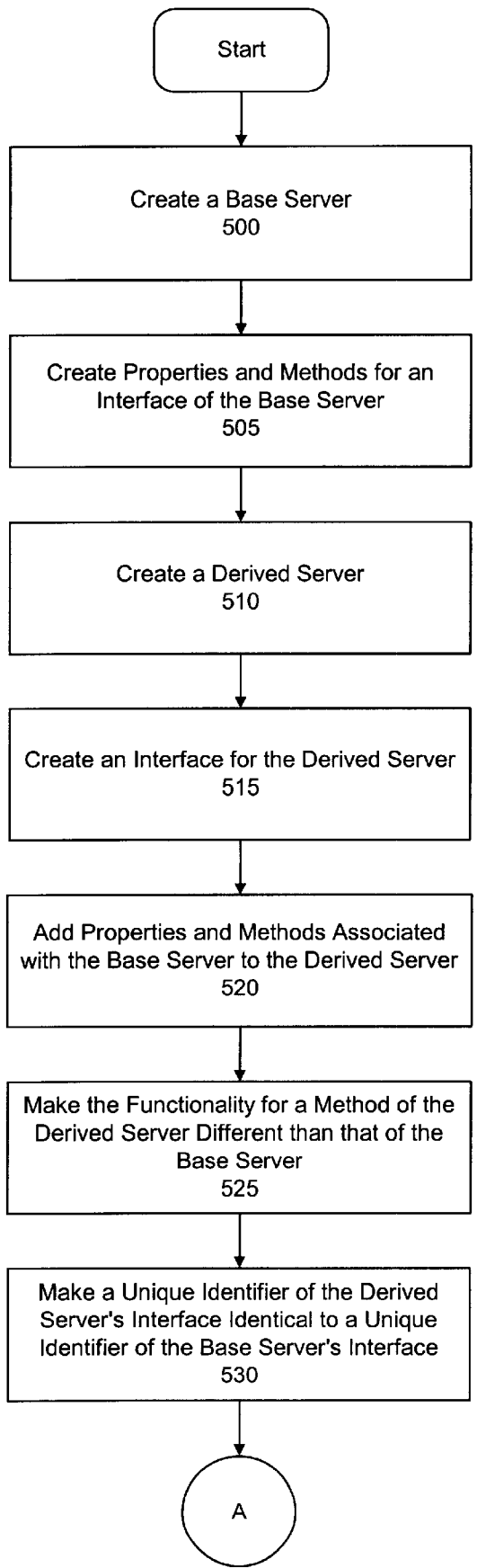
FIGS. 5a and b is a block diagram showing a method for obtaining a result based on a different functionality associated with a derived server according to one embodiment.
Figure 5B:
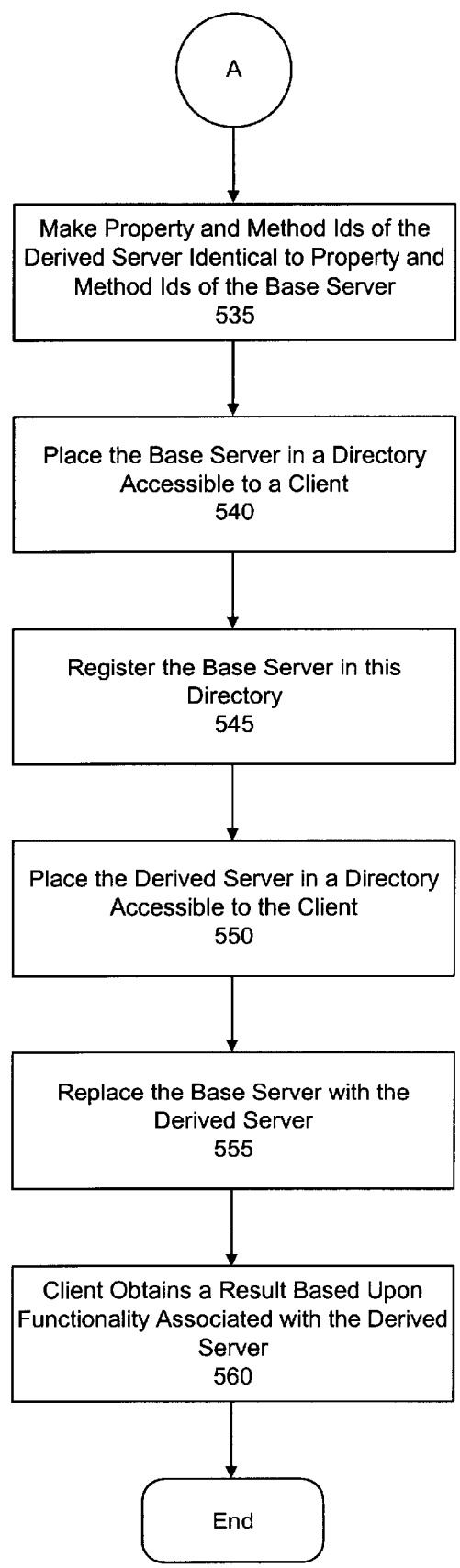

The method is generally characterized by but not limited to the following blocks shown in FIG. 5. At block 500 a base server is created or provided. The base server has one or more interfaces to allow the server to interoperate with one or more clients. In one embodiment, the base server is a base COM server and the interface is either the standard COM interface (i.e., IUnknown) or a customized interface that may be used to access a particular functionality associated with the base COM server.

In one embodiment the base server contains generic functions, properties and methods that allow interoperation with the client, such as the IUnknown interface. The base server may have only the minimum or necessary functionality or may have functionality that allows the client to perform specific tasks or calculations. For example, in the field of circuit board testing, the base server may have functionality to test zero, one, or more types of circuit board. In one embodiment the base server may have functionality corresponding to default or commonly used functionality needed by a client, such as for testing a common circuit board.

At block 505 properties and methods may be created that correspond to one or more of the interfaces of the base server, in addition to any required properties and methods (e.g., such as to enable the IUnknown interface in COM). Typically, methods are functions that clients may interoperate with via the interface and properties are data items that may be manipulated. In one embodiment, properties and methods are created in the base COM server that will be needed to access and utilize functionality in derived servers, which will be created to obtain results based upon a particular functionality. As discussed above, in the base server these methods and properties may be primarily placeholders, or may contain useful functionality. In one embodiment, COM and the Active Template Library (ATL), which facilitates the development of COM servers, may be used.

At block 510 a derived server is created (e.g., coded) or provided. Typically the derived COM server is created with the intention to extend the functionality available to the client, by adding functionality not provided by the base server. Accordingly, in some embodiments, additional functionality may be added to the derived server by adding one or more properties, methods, interfaces, or other items. In one embodiment, the derived server may be a derived COM server, and like the base COM server, the derived COM server may be created using ATL or another means. In some embodiments, the derived server may have a different name than the base server, while in other embodiments the names may be the same. In one embodiment, the base server may be first replicated to form a replicate, followed by modifying the replicate of the base server to generate the derived server. Advantageously, in this manner there is less opportunity for error.

At block 515 an interface is created in the derived server. In one embodiment, the interface will be a COM interface, either the IUnknown interface of COM or a customized interface. In one embodiment, the interface will be associated with an IDL file. The interface may have the same name as an interface in the base COM server, however the interface may be created with a different name that may be subsequently changed to the name used in the base COM server at the time of replacement of the base COM server with the derived COM server as described further below.

At block 520 properties and methods associated with the base server are added (e.g., coded) to the derived server. In one embodiment, the properties and methods listed in an IDL file of the base COM server are added to an IDL file of the derived server. In one embodiment, all of the properties and methods in the IDL file of the base COM server are added to the IDL file of the derived COM server. In one embodiment, properties and methods in h-extension and .cpp-extension files of the base COM server are added to the h-extension and .cpp-extension files of the derived COM server.

At block 525, functionality for one or more methods associated with the derived server is made different than the functionality of the corresponding one or more methods associated with the base server. In one embodiment, code is added to a generic method associated with the base server that has been added to the derived server, the code being added to impart a particular functionality to the derived server. In one embodiment, specific code is added to the derived COM server for each function listed in the IDL file of the derived COM server. In the circuit board testing example, specific code may be added to the derived server to permit testing of a particular circuit board.

At block 530, a unique identifier associated with the derived server's interface is made identical to a unique identifier associated with the base server's interface. In one embodiment, the base and derived servers are COM servers, the unique identifiers are UUIDs, and the IDL file of the derived COM server is edited to make the UUID of the interface and the UUID of the class identical to the UUID of the interface and the UUID of the class of the base COM server. Typically, a third UUID in COM, the UUID for the typelibrary, need not be edited to make it the same in the base and derived COM servers.

At block 535, property and method identifications of the derived server are made identical to property and method identifications of the base server. In one embodiment, the base and derived servers are COM servers and the IDL file of the derived COM server is edited to make the property and method identifications match.

At block 540 the base server executable is placed in a directory that is accessible to the client. In one embodiment, the directory is a directory where the client will look to initiate the base server. The directory may be located on the same computer, or on another computer system connected to the computer containing the client by either an Intranet, Ethernet, or the Internet. That is, the directory may be functionally connected to other memory locations residing on the computer system, Intranet or Internet.

At block 545 the base server is registered as residing in this directory. In one embodiment, one or more unique identifiers associated with the base server are registered in this directory so that when clients attempt to access and utilize functionality associated with the base server, the functionality may be located via the registry. The registry may be a table or database and may be associated with the operating system of the computer system, such as the Windows registry, or may conceivably be associated with a web browser in a true distributed application. In one embodiment, the base server is a base COM server, the registering is done using the /RegServer command, and the one or more unique identifiers are one or more UUIDs associated with the base COM server.

At block 550 the derived server is placed in a directory that is accessible to the client. In one embodiment, the directory is a directory containing other derived servers that the client accesses to find a particular derived server to obtain a known and needed functionality. In one embodiment, the directory may be located on the same computer system or even in the same directory as the base server. When the base and derived servers are located in the same directory they will typically require different names. In another embodiment the derived server may be placed in a directory connected to the client by an Intranet, an Ethernet, or the Internet.

In certain embodiments the derived server may not be accessible to the client, although this may be less efficient. For example, other software may be used to access the derived server, or alternatively, the derived server may be manually accessed (e.g., by saving to a diskette and loading on the computer system of the client).

At block 555 the base server is replaced with the derived server. For example, the derived server may be copied or moved from its directory location to the directory containing the base server and the name of the derived server is changed to the name of the base server thereby overwriting the base server with the derived server. The base server may be deleted before or after the derived server is copied. In some embodiments, particularly when the derived server initially has the same name as the base server, the name change may not be required, and only the copying or moving may be sufficient. In other embodiments, particularly when the base COM server and the derived COM server are initially located in the same directory, only the name change may be needed. In certain embodiments and advantageously so, the replacement of the base server with the derived server may be done without altering or recompiling the client.

At block 560 the client obtains a result based on functionality associated with the derived server. This is possible because the client contains information that allows it to interoperate with the base server, and a unique system and method have been used to allow the client to interoperate with the derived server. For example, the client may obtain a result based upon a derived COM server and the result may be associated with the testing of a particular type of circuit board. Advantageously, in this manner runtime polymorphism is achieved by substituting the derived server for the base server without the need for recompilation and without the limitations associated with aggregation and containment.

Exemplary Variations of the System and Method

Many alterations of the above method are contemplated that do not deviate from the true scope of the present invention. Exemplary alterations that are contemplated by certain embodiments of the invention are discussed below, and would be apparent to one of ordinary skill in the art.

Different ordering of the blocks may be used. For example, the base server may be placed to its directory (i.e., block 540) and registered in that directory (i.e., block 545) before a derived server is created or provided (i.e., block 510). One or more blocks may also be added or eliminated. For example, the derived server may not need to be renamed if the initial name of the derived server is the same as the name of the base server, and the name of the derived server is not subsequently changed.

The blocks may be executed at different times. In one embodiment, one or more of the base and derived servers, interfaces, properties, methods, and one or more of the blocks discussed above may be created or performed days, weeks, months, or years before certain of the blocks discussed above are performed. In one embodiment, many of the blocks are performed ahead of time, so that relatively few blocks need to be performed at runtime, which may allow the client to quickly access the functionality of the derived server.

The blocks may also be executed by different implementers and at different locations. In one embodiment, a software developer may develop one or more of the base and derived servers, and interfaces, and perform zero one or more of the blocks, before providing them to a software user. In one embodiment, the software developer may provide the derived server with or without the different functionality discussed at block 525. In one embodiment, base or derived servers or modified base or derived COM servers may be downloaded from an Intranet or the Internet, or otherwise distributed on a computer-readable medium or carrier wave.

One or more of the blocks may also be executed automatically by software. For example, software may be developed to copy the derived server to the directory containing the base server. Block 525 typically would not be automated, but may be for certain functionalities and servers.

The invention is not limited to a single client, single base server and a single derived server, since the invention is equally applicable to different and more complicated software architectures exhibiting nesting, containment, aggregation, and other architectural constructs available in object-oriented or other environments. In one embodiment, a client is interoperable with a plurality of base servers by one or more of nesting, inheritance, containment and aggregation. For example, the client interoperate with a base server, and the base server may be associated with one or more inner servers by containment or aggregation. Then, a different functionality may be obtained by a system and method of the present invention for replacing an inner server with a derived server. In certain embodiments a base server may be replaced, by a system and method consistent with the present invention, with a plurality of derived servers, or vice versa. Accordingly, although a simple software architecture was used to demonstrate and discuss the invention, the invention is not so limited and may easily be adapted by one of ordinary skill in the art to any of the object-oriented or other architectural construct.

Implementation in Non-COM Environments

Certain embodiment of the invention are not based on COM. Those of ordinary skill in the art will recognize that the invention is equally applicable to Common Object Request Broker Architecture (CORBA), which is also based on the Interface Definition Language (IDL), IIOP, or other software environments including non-Windows based environments and platforms. For example, the concepts of certain embodiments of the invention may be easily extended to Macintosh, Solaris, Unix, or other platforms.

By way of example, CORBA may be used in certain embodiments of the invention in place of COM or DCOM. CORBA is a standard for communicating between distributed objects and a software-based communications interface through which objects are located and accessed. CORBA allows objects written in different programming languages running on different platforms to be executed irrespective of their location on a network. Accordingly, clients requesting processing on one computer may use CORBA to request processing on another computer. CORBA objects are defined by the Interface Definition Language (IDL). Accordingly, CORBA has many similarities with COM, as both are based on the idea of encapsulation and exposure of an interface. Those of ordinary skill in the art will recognize that certain embodiments of the invention may be equally applicable to CORBA or other analogous standards.

Exemplary Computer Architecture

As discussed herein, a "system" may be an apparatus including hardware and/or software for processing data. The system may include, but is not limited to, a computer (e.g., portable, laptop, desktop, server, mainframe, etc.), hard copy equipment (e.g., printer, plotter, fax machine, etc.), banking equipment (e.g., an automated teller machine), and the like.

Figure 6:
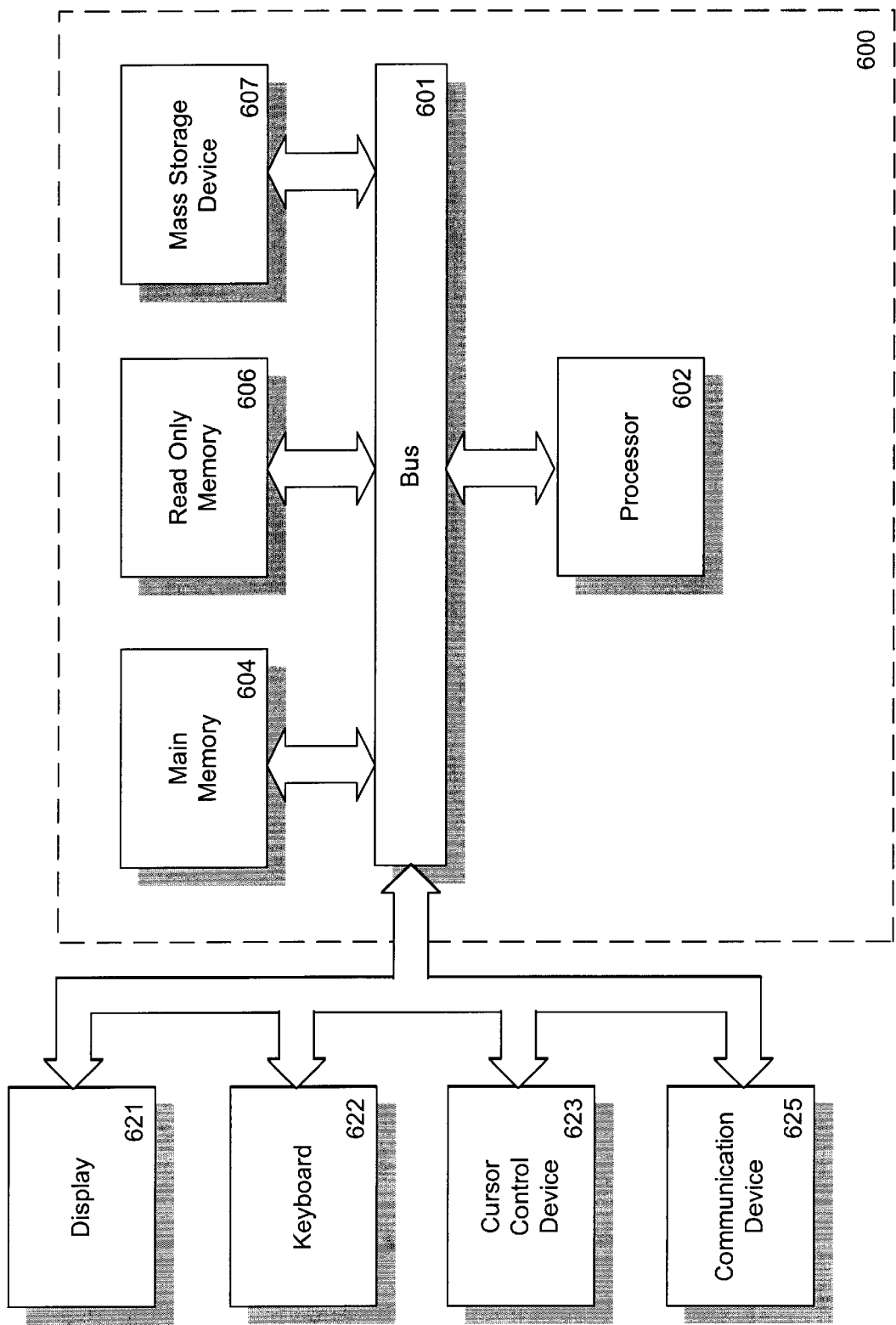
FIG. 6 is a block diagram of a computer system upon which one embodiment of the present invention may be implemented.

A computer system 600 representing an exemplary workstation, host, or server in which features of the present invention may be implemented will now be described with reference to FIG. 6. Computer system 600 represents one possible computer system for implementing embodiments of the present invention, however other computer systems and variations of computer system 600 are also possible. Computer system 600 comprises a bus or other communication means 601 for communicating information, and a processing means such as processor 602 coupled with bus 601 for processing information. Computer system 600 further comprises a random access memory (RAM) or other dynamic storage device 604 (referred to as main memory), coupled to bus 601 for storing information and instructions to be executed by processor 602. Main memory 604 also may be used for storing temporary variables or other intermediate information during execution of instructions by processor 602. Computer system 600 also comprises a read only memory (ROM) and/or other static storage device 606 coupled to bus 601 for storing static information and instructions for processor 602.

A data storage device 607 such as a magnetic disk, zip, or optical disc and its corresponding drive may also be coupled to computer system 600 for storing information and instructions. For example, applications and servers may be loaded onto computer system 600 by inserting a computer-readable medium into mass storage device 607. Computer system 600 may also be coupled via bus 601 to a data output device 621. The data output device 621 will typically be a printer or a display device, such as a cathode ray tube (CRT) or Liquid Crystal Display (LCD), for displaying information to an end user. For example, the data output device 621 may be a CRT for facilitating with information input and output from a computer user who is developing clients or servers, or who is using software for its intended purpose. Typically, a data input device 622, such as an alphanumeric input device or keyboard, including alphanumeric and other keys, may be coupled to bus 601 for communicating information and/or command selections to processor 602. Another type of user input device is cursor control 623, such as a mouse, a trackball, or cursor direction keys for communicating direction information and command selections to processor 602 and for controlling cursor movement on a display device. The data input device may also be a barcode scanner.

A communication device 625 is also coupled to bus 601. Depending upon the particular implementation, the communication device 625 may include a modem, a network interface card, or other well-known interface devices, such as those used for coupling to Ethernet, token ring, or other types of physical attachment for purposes of providing a communication link to support a local or wide area network, for example. In any event, in this manner, the computer system 600 may be coupled to a number of clients and/or servers via a conventional network infrastructure, such as a company's Intranet and/or the Internet, for example. Communication device 625 may allow software, such as servers with new or different functionality to be accessed from a remote location and downloaded for storage or use on computer system 600.

Testing of Circuit Boards

Prior art software applications for controlling the testing of circuit boards have typically required extensive customization to the specific hardware and software environment of a manufacturing or testing facility, and have required frequent modification. Several reasons for the extensive customization is that the applications have been used in environments with different factory database systems (e.g., InFix, Microsoft SQL, etc.), different software platforms (e.g., Windows, Macintosh), different instrumentation and testing equipment, and have been used to test different types of circuit boards. Accordingly, applications that are more universal would be desirable. The frequent modification of these applications has typically been caused by the introduction of new types of circuit boards, new tests, and hardware (e.g., testing equipment) replacements and upgrades. Accordingly, applications exhibiting changeability are also desired.

COM may be used to make applications more universal, however even with COM changeability is typically not provided. As an example, consider using COM to test circuit boards. A first COM server or set of COM servers may be used in conjunction with testing Intel Pentium® Pro processor boards, while another COM server or set of COM servers may be used in conjunction with testing Pentium® II processor boards. Accordingly the application may be compiled against these known COM servers. However, in the past when a new Intel board product such as the Intel Pentium® III processor board, needs to be tested, either a new COM server would have to be created or new functionality would have to be incorporated into an existing COM server. In any event, a new interface would be introduced and the application would have to be recompiled to introduce this interface.

Accordingly, the previously discussed system and method are highly applicable to clients known as host controllers that are used to control the testing of circuit boards. Broadly stated, embodiments of the present invention seek to provide increased functionality to a host controller that is able to interoperate with a base server, by using a unique system and method in which derived COM servers are changed and substituted for the base COM server, so that they may interoperate with the client, according to the system and method of certain embodiments of the present invention. In one embodiment, the system and method may involve making at least one unique identifier associated with the derived server identical to at least one unique identifier associated with the base server. In one embodiment, the base and derived servers are COM servers and the system and method may include making at least one UUID associated with the derived COM server identical to at least one UUID with the base COM server. Advantageously, certain embodiments permit the client to access and utilize the functionality of the derived server at runtime without recompilation against the functionality of the derived server, which is a significant improvement over the prior art.

Method for Testing Circuit Boards According to One Embodiment

Figure 7:
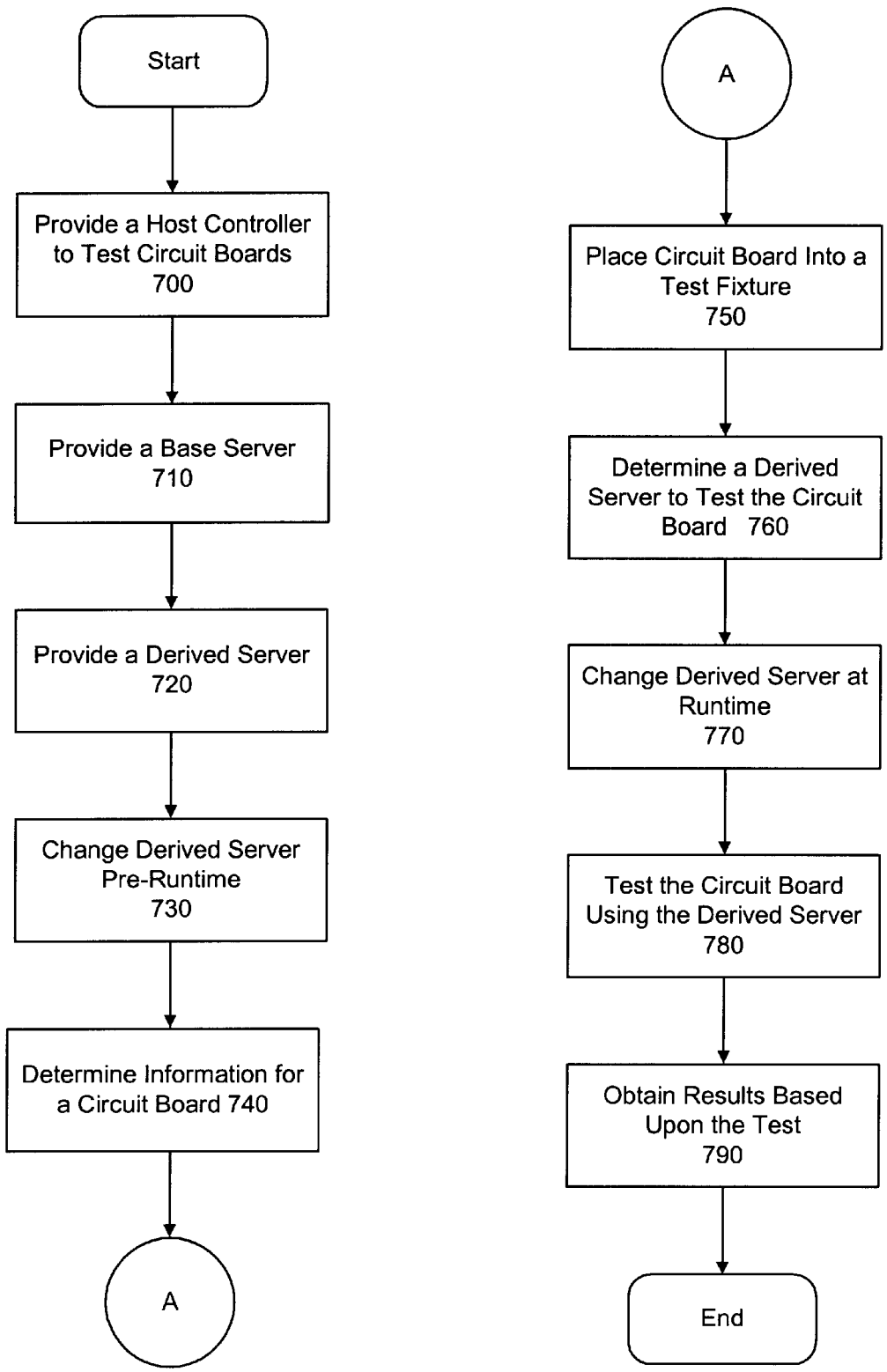
FIG. 7 is a block diagram showing a method for testing circuit boards according to one embodiment.

A method for testing circuit boards is generally characterized by but not limited to the following blocks shown in FIG. 7. At block 700 a host controller for testing circuit boards is created or provided. The host controller may be written in any number of computer languages.

At block 710 a base server is created or provided. In one embodiment, the base server has an interface for interoperating with the host controller. In one embodiment, the base server is a base COM server.

At block 720 a derived server is created or provided. In one embodiment, the derived server may be created to allow access and utilization of a new functionality, such as functionality to test a different circuit board. The derived server may not be initially able to interoperate with the host controller. For example, the host controller may not know one or more unique identifiers that are needed to access and utilize functionality associated with the derived server. In one embodiment, the derived server is a derived COM server, and the one or more unique identifiers associated with the derived COM server are UUIDs. In some embodiments, the derived server may have a different name than the base server.

At block 730 part of a system and method may be used pre-runtime to partly prepare the host controller to interoperate with the derived server. This may include performing any portion of the system and method previously discussed. In one embodiment, the base and derived servers are COM servers and the system and the partly preparing includes: (1) creating properties and methods in the base COM server that will be needed to access and utilize different functionality in a derived COM server, (2) creating an interface in the derived COM server with the same name as an interface in the base COM server, (3) adding properties and methods listed in an IDL file of the base COM server to an IDL file of the derived COM server, (4) adding properties and methods in h-extension and .cpp-extension files of the base COM server to the h-extension and .cpp-extension files of the derived COM server, (5) adding code to a method associated with the derived COM server, the code being added to impart a particular functionality to the derived COM server, (6) editing the IDL file of the derived COM server to make the UUID of the interface and the UUID of the class identical to the UUID of the interface and the UUID of the class of the base COM server, (7) editing the IDL file of the derived COM server to make the property and method identifications match the property and method identifications of the base COM server, (8) placing the base COM server in a directory that is accessible to the host controller and which is the directory the host controller will use to initiate the base COM server, (9) registering the base COM server in this directory using the /RegServer command, and (10) placing the derived COM server in a directory that is accessible to the client and which is the directory the host controller will look to find the derived COM server.

At block 740 information is determined about the circuit board to be tested. In one embodiment, a test operator may manually enter this information. In another embodiment any other data input device, such as a barcode scanner, may be used to enter information about the circuit board to be tested. This information may include a serial number, barcode, unique identifier, or other information that may be used to associate the circuit board with a particular test.

At block 750 the unit is placed in a test fixture. In one embodiment, the unit may be automatically placed in the test fixture. In other embodiments the unit may be placed in the test fixture before the information is determined about the circuit board to be tested. For example, the test fixture may include a barcode scanner operable to read a barcode when the unit is placed in the test fixture.

At block 760 the information is used to determine a derived server for testing the circuit board. In one embodiment, the information, such as a serial number, is used to look up a derived server, such as a derived COM server, in a table or database. In one embodiment, the circuit board type and the necessary test are looked up using the information in a factory database server. In one embodiment, it may be determined whether the test system configuration may test the current unit under test. For example, it may be determined if the circuit board or the needed test for the circuit board are different than the previously tested circuit board or test, in which case a derived server for testing the circuit board may not need to be determined, since the system may already be able to test the circuit board.

At block 770 part of a system and method may be used at runtime to finish preparing the host controller to interoperate with the derived server. Any portion of the previously discussed systems and methods may be used. In one embodiment, the base and derived servers are COM servers and the system and method may include: (1) copying the derived COM server to the directory containing the base COM server, (2) changing the name of the derived COM server to the name of the base COM server. Other variations that either would be obvious to one of ordinary skill in the art or that have previously been mentioned may also be used as part of the system and method.

At block 780 the derived server is used in place of the base server to test the circuit board. In one embodiment, a host controller uses instructions to interoperate with the modified derived COM server through accessing interfaces having UUIDs previously associated with the base COM server and registered in a particular directory. The actual testing of the unit is not a limitation of the present invention. A typical test for a unit under test might include powering up the unit, one or more pretests (e.g., boundary scan tests), sending and receiving data between the host controller, one or more derived servers, and the unit under test (this data may involve measuring the power or current sent and or received from the unit under test), powering down the unit under test, ejecting the unit or otherwise providing an indication that the unit has completed the test, and sending information associated with the test to a memory, such as a factory database. The test control COM server may send and receive data, and may accept, process or execute requests from the unit under test including controlling test instrumentation.

At block 790 results are obtained based upon the test. In one embodiment, the results may include information indicting whether the unit has any detectable defects. These results may be used to perform either additional testing (e.g., to determine the precise defect at the component level), to update manufacturing statistics (e.g., location and cause of the fault may also be recoded along with serial number and unit type), and optionally to attempt to repair defective sections of the circuit. Troubleshooting and process improvements may also be based upon test results and statistics.

System for Testing Circuit Boards According to One Embodiment

Figure 8:
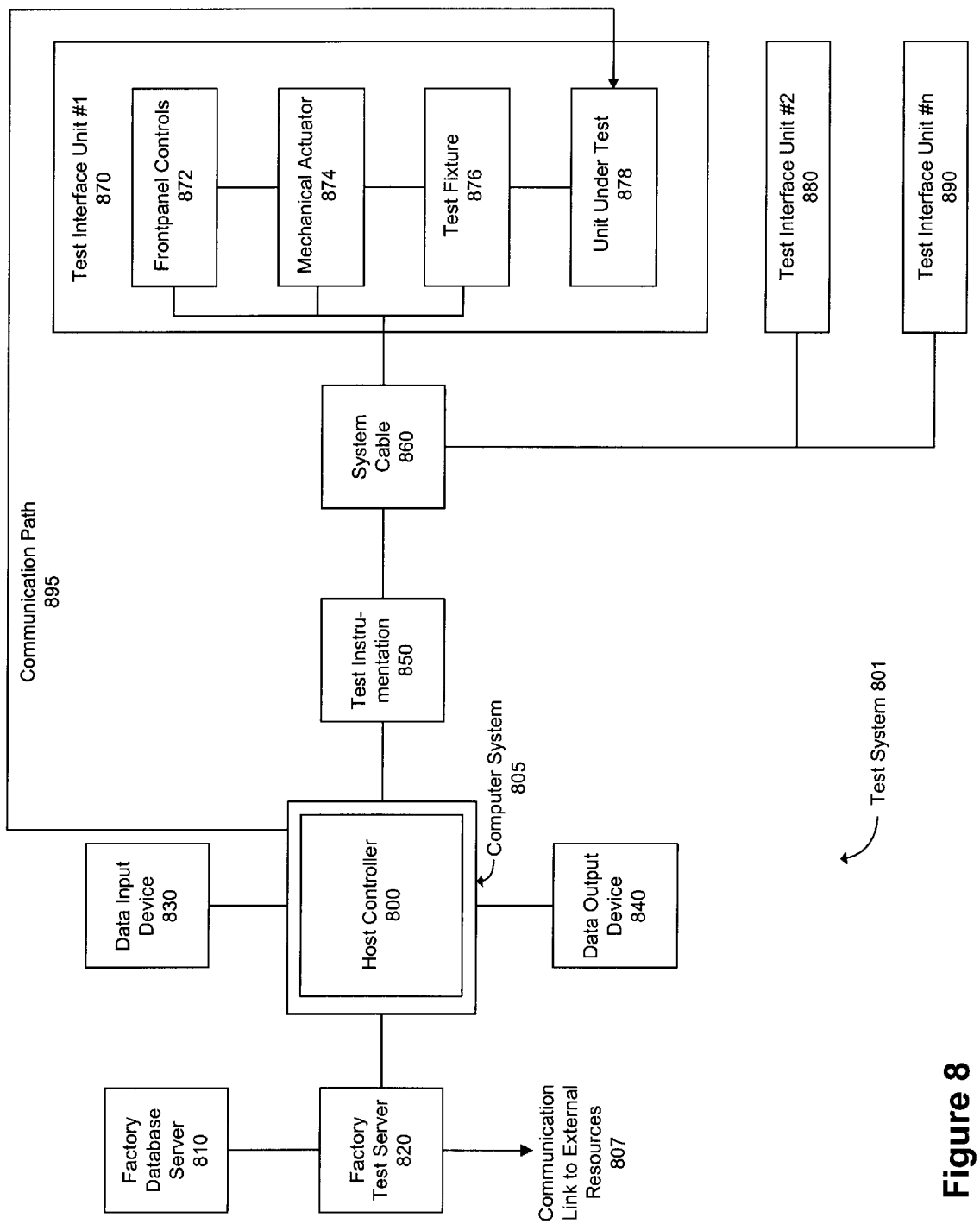
FIG. 8 is an exemplary circuit board test system hardware configuration according to one embodiment.

FIG. 8 shows an exemplary test system 801 that generally characterizes but does not limit the scope of certain embodiments of the present invention. FIG. 8 shows a host controller 800 connected with a factory database server 810, a factory test server 820, a data input device 830, a data output device 840, test instrumentation 850, system cable 860, test interface unit #1 870, test interface unit #2 880, and test interface unit #n 890. Test interface unit #1 870 includes frontpanel controls 872, mechanical actuator 874, test fixture 876, and unit under test 878.

The factory database server 810 may be used to maintain a database containing data associated with a unit, such as a circuit board. For example, for a given unit the database may include a unique identifier for the unit, data representing the type of unit, a time and place of manufacture of the unit, data from previous testing of the unit, data associating the unit with a particular manufacturing batch, marketing data for the unit, statistics such as quality control information for the unit and for the type of unit (e.g., fault frequency data for a circuit type), and other data. In one embodiment, the factory database server 810 may include data that allows a unit or a type of unit to be associated with one or more servers to be used in conjunction with testing of the unit or a unit of the given type. For example, the data input device 830 may accept a serial number for a unit, the serial number corresponding to a particular to be performed and associated with a particular COM server. Factory database server 810 may include any type of database or enterprise management software.

The factory database server is connected to the factory test server 820 and the host controller 800 by a communication link. In one embodiment, the connection may be an Ethernet connection. However, any connection that allows data, such as a unique identifier or test performance data to be communicated from the host controller 800 to the factory database server 810, or the reverse of this communication, may also be used.

The factory test server 820 may be used to store test software and test data from one or more test interface units. In one embodiment, the factory test server 820 may contain a plurality of potential servers or COM servers to be used to test circuit boards. The factory test server 820 may also include data that allows a unit or a type of unit to be associated with one or more servers (e.g., COM servers) that may be used to test the unit. For example, the data input device 830 may accept a unique identifier (e.g., serial number) for a unit, the unique identifier corresponding to a particular test to be performed and associated with a particular COM server. In one embodiment, the factory test server 820 is connected to the factory database server 810 and the computer system 805 containing the host controller 800. In one embodiment, the connection may be an Ethernet connection. However, any connection that allows data, such as COM servers to be used in testing the unit, to be copied or accessed by the host controller 800, and that allows a unique identifier to be communicated to the factory test server may also be used. The factory test server 820 may also have a communication link to external resources 807 that allows data to be sent or received from computer systems external to test system 801. For example, the link may provide a means of exchanging information with external computer systems also connected by a link to an Intranet or the Internet. Any hardware link or wireless link or any other link that allows data to be exchanged between test system 801 and an external computer system may be used.

The host controller is located on computer system 805 and fully or partly controls test system 801, including hardware and other software, and collects and manages test data. Computer system 805 is not a limitation of the present invention and refers to the computer system shown and discussed in FIG. 6. In one embodiment, the host controller controls and manages many of the operations associated with the testing of units. The host controller 800 is able to call functions associated with the base server, for example those listed in an IDL file of a base COM server. For example, the host controller 800 may control the test instrumentation 850 (e.g., powering up the unit under test). The host controller 800 may request data from the factory test server 820 (e.g., a COM server to test a unit) and read or write data to or from the factory database server 810. The host controller 800 may include sequences of instructions for performing calculations on the data received from test interface unit #1 870. The host controller may optionally have a debut mode to allow a test developer to develop and debug a test in real time. In one embodiment, the host controller 800 may be universal, meaning that it may interface with any test suite, control any test system hardware, and communicate with any factory database system. In one embodiment, the host controller 800 may also have a separate communication path 895 with the unit under test 878.

For example, the communication path 895 may be an RS232/USB bus or equivalent.

The host controller 800 is connected to the data input device 830 and the data output device 840. Data input device 830 and data output device 840 may be any existing or future device that allows data entry to or retrieval of data or information from computer system 805. The data entry or retrieval may be directly to or from computer system 805 or may be indirect (e.g., through data entry at test interface unit #1 870). The data output device may be any existing or future device that allows data or information retrieval from computer system 805, directly or indirectly. The data output device 840 of one embodiment is a graphical user interface that a test operator may use to receive testing status or test results for a unit under test. In one embodiment, the user will be able to use the data input device 830 and output device 840 to obtain results of previous tests, such as the results that may be stored in the factory database server 810. Reports summarizing past tests for units may also be requested and output through data input device 830 and data output device 840.

In one embodiment, the data input device may be a device for reading a barcode, such as a laser-based bar code reader. The barcode scanner may retrieve information indicating a serial number or unit type. For example, a laser or other scanner may scan a bar code to determine the serial number identifying a given circuit board. The bar code may also contain a product code for the circuit board, or the serial number may allow the determination of the product code and information regarding the testing to be performed for the given circuit board from a database. In one embodiment, the barcode reader communicates to the computer system 805 by an electrical signal connection such as a RS232, USB, GPIB, or PCI connection.

Test instrumentation 850 is connected to the computer system 805 and includes test instruments that may be used to in conjunction with controlling the mechanical actuator 874, powering the test interface unit #1 870, powering the unit under test 878, providing stimulus to the unit under test 878 as directed by the host controller 800, reading response from the unit under test 878, monitoring the test system for potential hazardous conditions, shutting down a portion of test system 801 upon the detection of a hazardous condition, and responding to data input by the test operator, such as data input at the data input device 830 or frontpanel controls 872. In one embodiment, the computer system 805 may be connected to the test instrumentation 850 via one or more electrical connections, such as an RS232, USB, GPIB, or PCI bus.

A cable map may be used to define the mapping of all electrical connections between the test instrumentation and the test interface unit at run time. In one embodiment, the cable map may be a file such as a text file that may be consulted to obtain defining information for a particular cable or electrical connection. Defining information may include signal name, test instrument name, test instrument connection (e.g. channel or pin), send address, channel, and pertinent parameters of the signal and the test instrument that it is connected to. In one embodiment, the host controller or the base or derived servers may access the cable map to obtain defining information, so that when the defining parameters need to be changed, the host controller or servers do not need to be changed, just the cable map text file. In this way the cable map may assist in developing a test system COM server, test control COM server, factory database COM server, and front panel COM server.

Test interface unit #1 870 includes frontpanel controls 872, mechanical actuator 874, test fixture 876, and unit under test 878. In one embodiment, the test interface unit may also include software and processing capability that allows test interface unit #1 to partly or fully operate based on simplified control directions received from the host controller 800. The frontpanel controls 872 may allow data input by the test operator. For example, the frontpanel may allow the test operator to start the test. The mechanical actuator 874 automatically inserts a unit into the test fixture 876. The test fixture 876 includes an electrical connection with the unit under test 878. For example, the test fixture 876 may include an electrical connection to a processor or circuits debug port, which gives access to the circuits built-in test features. In one embodiment, the electrical connection may be an electrical connection to stimulate the circuit board with a binary test sequence or involve a PCI card. The electrical connection may also allow component level testing and involve a logic probe, oscilloscope, or the equivalent. The unit under test 878 is a unit that is to be tested by the test interface unit #1 870. In one embodiment, the unit under test is a circuit board. The test interface unit #1 is connected to the test instrumentation 850 by the system cable 860. In one embodiment, system cable 860 has been custom designed for the test interface unit 870. In other embodiments, standard electrical connections are possible. In one embodiment, the test interface unit #1 870 or test fixture 876 may be able to indicate to the host controller 800 that a unit has been inserted in the test fixture or request that a unit be placed in the test fixture 876, for example by displaying an indication of preparedness on a graphical user interface.

As stated above, many variations of the test system 801 are contemplated that do not deviate from the true scope of the present invention. One embodiment may not need one or more of the factory database server 810, the factory test server 820, the data input device 830, the data output device 840, the system cable 860, the frontpanel controls 872, the mechanical actuator 874, the test interface unit #2 880, or the test interface unit #n 890. For example, the mechanical actuator may not be needed if an operator is to insert a circuit board into the test fixture. Also, the frontpanel controls may not be needed, since testing may be automatically started and stopped by the client upon insertion of a circuit board into the test fixture 876.

Another variation may have the data input device 830 or data output device 840 connected to test interface unit #1 870 rather than connected directly to the host controller 800. This may allow the particular test results for test interface unit #1 870 to be displayed locally. For example, in one embodiment, the unit under test 878 may be placed into the test fixture 876 and the data input device 830, which may be a barcode scanner, may automatically read a barcode on the unit under test 878, so that subsequent testing may be customized to the particular unit under test 878.

Although the factory database server 810 and the factory test server 820 are shown as separate entities, which may offer advantages to large manufacturing facilities such as information security, other embodiments allow the factory database server 810 to be combined with one or more of the factory test server 820 or the computer system 805. The physical location of the software and data associated with the factory database server 810 is not a limitation of the present invention. In one embodiment, it may be possible to locate an item of software having certain of the functions associated with the factory database server (e.g., such as containing data associated with one ore more circuit boards) or locate an item of software having certain of the functions associated with the factory test server 820 (e.g., such as test software and test data) on the computer system 805 containing the host controller 800. For example, the test software and test data may be located on the computer system 805.

Another variation may allow the computer system 805 to communicate directly to the factory database server 810 rather than indirectly through the factory test server 820. Although this may not be preferred, since it may increase the risk of failure or reduce the security of confidential information.

One embodiment of the invention only requires the host controller 800 and the computer system 805. For example, the host controller 800 may be used as a simulator for the testing of circuit boards for training or development purposes. Accordingly, the host controller 800 may be located on computer system 805 with a data output device 840 for interacting with a computer user. The test instrumentation 850, test fixture 876 and others may or may not be present.

The invention is not limited to the particular way that the system and method is implemented using objects, servers, and functionality, since this is an implementation detail affected by specifics. However, in one embodiment, each major hardware component has a corresponding software object or server to control its functionality or communicate with it. Also, frequently .dll-extension and h-extension files may be available from an instrument manufacturer and may be incorporated. Certain embodiments may also include the development of a class factory to enable testing on multiple instruments of the same kind.

Accordingly, systems and methods according to certain embodiments of the invention provide universality and changeability to host controllers for testing circuit boards. This provides a number of advantages. A first advantage is reduced time to develop and change the software to control a test system, since the system and method is more changeable, and new functionality may be isolated and separately modified. A second advantage is that operators and test developers only need to learn the use of one host controller instead of many, since the host controller may be developed in a more universal software environment. A third advantage is that the level of support of the software decreases, since different host controllers do not have to be developed and supported for each type of test system.

Certain embodiments of the invention may also be used to test any type of manufactured unit. For example, the system and method may be used to test various electronic or mechanical systems associated with automobiles, electronic devices (e.g., telephones, radios, televisions, photocopiers, printers), satellites, and other devices. The system and method may also be used in a manufacturing environment where the testing may involve weighing a product (such as bottled beverages) or otherwise testing for manufacturing conformity. Accordingly, in some embodiments, the system and method discussed above may be modified by one of ordinary skill in the art to perform testing of a wide variety of units other than circuit boards.

In conclusion, embodiments of the present invention provide a system and method for improving the testing of circuit boards. More specifically, embodiments of the invention provide a system and method for allowing an application for controlling circuit board testing to interoperate with and obtain a result from a derived server having a first functionality based on an existing relationship between the client and a base server having a second functionality.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for testing a manufactured unit, comprising:
providing an application to control the testing of manufactured units, the application configured to interoperate with a first server having a first functionality by using a first interface, the first interface having at least one first unique identifier;
providing a second server derived from the first server and having a second functionality associated with the testing of manufactured units and a second interface, the second interface having at least one second unique identifier;
placing a manufactured unit to be tested in a test fixture;
allowing the application to interoperate with the second server and obtain a result based on the second functionality by making the at least one second unique identifier identical to the at least one first unique identifier and replacing the first server with the second server at runtime; and
testing the manufactured unit based on an interoperation between the application and the second server.

2. The method of claim 1, wherein the first and second servers are COM servers and wherein the at least one first unique identifier and the at least one second unique identifier are at least two first UUIDs and at least two second UUIDs, and wherein making comprises editing an IDL file of the second COM server to make the at least two second UUIDs identical to the at least two first UUIDs.

3. The method of claim 2, wherein testing comprises testing a manufactured unit based on the second functionality without recompiling the application.

4. The method of claim 2, wherein allowing further comprises registering the first COM server in a directory and wherein replacing further comprises moving the second COM server to the directory.

5. The method of claim 2, further comprising making a name of the second interface identical to a name of the first interface.

6. The method of claim 2, wherein the first functionality comprises a first set of operations and wherein the second functionality comprises a second set of operations, at least one operation of the second set of operations different from at least one operation of the first set of operations.

7. The method of claim 2, wherein making does not include making a UUID associated with a TypeLibrary of the second COM server identical to a UUID associated with a TypeLibrary of the first COM server.

8. The method of claim 1, wherein prior to making, a client is not operable to obtain a result based on the second functionality by interoperating with the second server.

9. The method of claim 8, further comprising adding properties and methods associated with the first server to the second server.

10. The method of claim 9, wherein allowing further comprises registering the first server in a directory by storing the at least one first unique identifier in a registry, and wherein testing further includes the application looking for the at least one first unique, identifier in the registry.

11. The method of claim 1, further comprising:
determining unit information for a unit to be tested; and
using the unit information to determine the second server appropriate for testing the unit.

12. A machine-readable medium having stored thereon data representing sequences of instructions, the sequences of instructions which, when executed by a machine, cause the machine to allow an application for testing manufactured units and configured to interoperate with a first server to interoperate with a second server, the first server having a first functionality and a first interface having at least one first unique identifier, the second server having a second functionality and a second interface having at least one second unique identifier, wherein the instructions causing the machine to allow include instructions causing the machine to make the at least one second unique identifier identical to the at least one first unique identifier and replace the first server with the second server at runtime.

13. The machine-readable medium of claim 12, wherein the first and second servers are COM servers and wherein the at least one first unique identifier and the at least one second unique identifier are at least two first UUIDs and at least two second UUIDs, and wherein the instructions to make further comprise instructions causing the machine to edit an IDL file of the second COM server to make the at least two second UUIDs identical to the at least two first UUIDs.

14. The machine-readable medium of claim 13, wherein the instructions to allow further comprise instructions causing the machine to allow a client to interoperate with the second server without recompiling the client.

15. The machine-readable medium of claim 14, wherein the instructions to allow further comprise instructions causing the machine to register the first COM server in a directory and move the second COM server to the directory.

16. A system for testing manufactured units, comprising:
a logical memory storing an application for controlling the testing of manufactured units and configured to interoperate with a first server having a first functionality by using a first interface, the first interface having at least one first unique identifier;
the logical memory further storing a second server derived from the first server and having a second functionality and a second interface, the second interface having at least one second unique identifier; and
a computer system functionally connected with the logical memory and including a processor, the processor to obtain a result associated with the testing of manufactured units based on the second functionality, after the at least one second unique identifier is made identical to the at least one first unique identifier and the first server is replaced by the second server at runtime.

17. The system of claim 16, wherein the first and second servers are COM servers and wherein the at least one first unique identifier and the at least one second unique identifier are at least two first UUIDs and at least two second UUIDs, and wherein the processor obtains the result associated with the testing of the manufactured units based on the second functionality after an IDL file of the second COM server is edited to make the at least two second UUIDs identical to at least two first UUIDs.

18. The system of claim 17, wherein the processor obtains the result associated with the testing of the manufactured units based on the second functionality without recompiling a client.

19. The system of claim 18, wherein the processor obtains the result associated with the testing of the manufactured units based on the second functionality after the first COM server is registered in a directory and the second COM server is moved to the directory.

20. The method of claim 16, further comprising providing appearance of polymorphism from perspective of a client by dynamically selecting among a plurality of derived COM servers at runtime based upon functionality needed by the client to test a circuit board.

21. A method comprising:

providing a client for controlling the testing of circuit boards;

providing a base COM server having an interface to interoperate with the client, the base COM server having a first name and the interface having a second name, wherein the base COM server is located in a first directory, and wherein the base COM server has been registered in the first directory by storing at least one first UUID in a registry;

placing a circuit board to be tested in a test interface unit;

providing a derived COM server with a third name, wherein the derived COM server has an interface having a fourth name, and wherein the derived COM server comprises properties and methods associated with the base COM server;

modifying an IDL file to make a UUID of the interface and a UUID of a class of the derived COM server identical to a UUID of the interface and a UUID of a class of the base COM server;

making identifications of properties and methods of the derived COM server identical to corresponding identifications of properties and methods of the base COM server;

making the third name of the derived COM server identical to the first name of the base COM server; and obtaining a result at the client associated with testing the circuit board based on one or more methods of the modified derived COM server.

22. The method of claim 21, wherein prior to modifying the IDL file the client is able to interoperate with the base COM server when the base COM server is located in the first directory.

23. The method of claim 21, further comprising making the fourth name for the interface of the derived COM server identical to the second name for the interface of the base COM server.

24. The method of claim 21, wherein the third name of the derived COM server is initially the same as the first name of the base COM server.

25. The method of claim 21, wherein a list of methods for the derived COM server is identical to a list of methods for the base COM server.

26. The method of claim 21:

wherein the derived COM server is initially located in a second directory, the second directory different from the first directory; and further comprising copying the derived COM server from the second directory to the first directory.

27. The method of claim 21, wherein the base COM server and the derived COM server are created using ATL.

* * * * *